(12) United States Patent
Kumura (10) Patent No.: US 11,322,425 B2
(45) Date of Patent: May 3, 2022

(54) SEMICONDUCTOR DEVICE

(71) Applicant: Dexerials Corporation, Tokyo (JP)

(72) Inventor: Tatsuo Kumura, Tokyo (JP)

(73) Assignee: Dexerials Corporation, Tokyo (JP)

( * ) Notice: Subject to any disclaimer, the term of this patent is extended or adjusted under 35 U.S.C. 154(b) by 0 days.

(21) Appl. No.: 17/041,440

(22) PCT Filed: Feb. 25, 2019

(86) PCT No.: PCT/JP2019/007113
§ 371 (c)(1),
(2) Date: Sep. 25, 2020

(87) PCT Pub. No.: WO2019/193868
PCT Pub. Date: Oct. 10, 2019

(65) Prior Publication Data
US 2021/0020542 A1 Jan. 21, 2021

(30) Foreign Application Priority Data

Apr. 4, 2018 (JP) ................ JP2018-072770

(51) Int. Cl.
*H01L 23/433* (2006.01)
*H01L 23/552* (2006.01)
(52) U.S. Cl.
CPC .......... *H01L 23/433* (2013.01); *H01L 23/552* (2013.01)
(58) Field of Classification Search
CPC ................ H01L 23/433; H01L 23/552
See application file for complete search history.

(56) References Cited

U.S. PATENT DOCUMENTS

2003/0193794 A1* 10/2003 Reis ............... H05K 7/20445
361/816
2016/0301442 A1* 10/2016 Sohn ..................... H04M 1/19
2017/0098592 A1* 4/2017 Jin ..................... H01L 23/3675

FOREIGN PATENT DOCUMENTS

| JP | 2002184916 A | 6/2002 |
| JP | 2006513556 A | 4/2006 |
| JP | 2012164852 A | 8/2012 |
| JP | 2016096249 A | 5/2016 |
| JP | 2017515300 A | 6/2017 |

(Continued)

OTHER PUBLICATIONS

Oct. 8, 2020, International Preliminary Report on Patentability issued in the International Patent Application No. PCT/JP2019/007113.

(Continued)

*Primary Examiner* — Peniel M Gumedzoe
(74) *Attorney, Agent, or Firm* — Kenja IP Law PC (57) ABSTRACT

Provided is a semiconductor device having excellent heat radiation performance and electromagnetic wave suppression effect. A semiconductor device 1 comprises: a semiconductor element 30 formed on a substrate 50; a conductive shield can 20 having an opening hole 21; a conductive cooling member 40 located above the conductive shield can 20; a heat conductive sheet 10 formed between the semiconductor element 30 and the conductive cooling member 40 at least through the opening hole 21; and a conductive member 11 electrically connecting the conductive shield can 20 and the conductive cooling member 40.

7 Claims, 7 Drawing Sheets

(56) References Cited

FOREIGN PATENT DOCUMENTS

JP        2018107272  A     7/2018

OTHER PUBLICATIONS

May 7, 2019, International Search Report issued in the International Patent Application No. PCT/JP2019/007113.
Feb. 22, 2022, Notification of Reasons for Refusal issued by the Japan Patent Office in the corresponding Japanese Patent Application No. 2018-072770.

* cited by examiner

SEMICONDUCTOR DEVICE

TECHNICAL FIELD

The present disclosure relates to a semiconductor device having excellent heat radiation performance and electromagnetic wave suppression effect.

BACKGROUND

Recent years have seen size reductions of electronic devices. Meanwhile, because power consumption cannot be significantly changed in order to cover a variety of applications, heat radiation measures for the devices have become more important.

As heat radiation measures for electronic devices, for example, radiator plates, heat pipes, and heatsinks made of metallic material having high heat conductivity such as copper or aluminum are widely used. Such a heat radiation component with excellent heat conductivity is located near an electronic component, such as a semiconductor package, which is a heating portion in an electronic device, to achieve heat radiation effect or temperature relaxation in the device. Further, the heat radiation component with excellent heat conductivity is located from the electronic component which is the heating portion through to a low-temperature region.

However, this causes the following problem: The heating portion in the electronic device is an electronic component such as a semiconductor element with high current density, and high current density means that the strength of an electric field or a magnetic field which can cause an unwanted radiation component is likely to be high. If the heat radiation component made of metal is located near the electronic component, the heat radiation component not only absorbs heat, but also picks up a harmonic component of an electric signal flowing in the electronic component. Specifically, since the heat radiation component is made of metallic material, the heat radiation component acts as an antenna for the harmonic component or acts as a transmission path for the harmonic noise component.

The development of techniques to achieve both heat radiation performance and electromagnetic wave suppression effect is therefore desirable.

For example, PTL 1 discloses a technique of providing, in a shield member having a large opening hole hole, a semiconductor package with a lid attached thereto and an annular lid contact portion in electrical contact with upper peripheral edges of the lid, and electrically connecting the lid contact portion and the shield member.

The technique described in PTL 1 produces certain levels of heat radiation performance and electromagnetic wave suppression effect. However, in the case where a substrate or a cooling member is large, electromagnetic resonance occurs, and sufficient electromagnetic wave suppression effect cannot be achieved. Moreover, further improvement in heat radiation performance is needed.

CITATION LIST

Patent Literature

PTL 1: JP 2012-164852A

SUMMARY

Technical Problem

It could therefore be helpful to provide a semiconductor device having excellent heat radiation performance and electromagnetic wave suppression effect.

Solution to Problem

Through extensive studies, we recognized that excellent electromagnetic wave absorption performance can be achieved by covering a semiconductor element with a conductive shield can connected to a ground. However, simply providing such a conductive shield can cannot achieve sufficient heat radiation performance. We accordingly conducted further studies, and discovered that, by forming an opening hole hole in the conductive shield can and forming a heat conductive sheet so as to at least pass through the opening hole hole to connect the semiconductor element and a conductive cooling member, heat radiation performance can be improved without a decrease in electromagnetic wave absorption performance. We further discovered that, by providing a conductive member between the upper surface of the conductive shield can and the lower surface of the conductive cooling member and electrically connecting the conductive shield can and the conductive cooling member, electromagnetic wave suppression effect can be improved even in the case where the conductive shield can has the opening hole hole.

Hence, a semiconductor device according to the present disclosure can achieve both heat radiation performance and electromagnetic wave suppression effect at higher level than conventional techniques.

The present disclosure is based on these discoveries. We thus provide:

(1) A semiconductor device comprising: a semiconductor element formed on a substrate; a conductive shield can connected to a ground and having an opening hole hole; a conductive cooling member located above the conductive shield can; a heat conductive sheet formed between the semiconductor element and the conductive cooling member at least through the opening hole hole of the conductive shield can; and a conductive member formed between an upper surface of the conductive shield can and a lower surface of the conductive cooling member, and electrically connecting the conductive shield can and the conductive cooling member.

With such a structure, excellent heat radiation performance and electromagnetic wave suppression effect can be achieved.

(2) The semiconductor device according to (1), wherein a spacing between parts of the conductive member facing each other with the heat conductive sheet therebetween is less than or equal to ¹⁄₁₀ of a wavelength at a maximum frequency of the semiconductor element.

(3) The semiconductor device according to (2), wherein the conductive member is connected to the conductive shield can and the conductive cooling member, to form an electrically closed region.

(4) The semiconductor device according to any one of (1) to (3), wherein a resistance value of the conductive member is 2Ω or less.

(5) The semiconductor device according to any one of (1) to (4), wherein the conductive member has tackiness or adhesiveness at a surface thereof.

(6) The semiconductor device according to any one of (1) to (5), wherein the conductive member contains a cured resin.

(7) The semiconductor device according to any one of (1) to (6), wherein the conductive member contains a conductive filler.

(8) The semiconductor device according to any one of (1) to (7), wherein the heat conductive sheet contains carbon fibers.

Advantageous Effect

It is thus possible to provide a semiconductor device having excellent heat radiation performance and electromagnetic wave suppression effect.

DETAILED DESCRIPTION

Embodiments of the present disclosure will be described in detail below, with reference to drawings.

Figure 1:
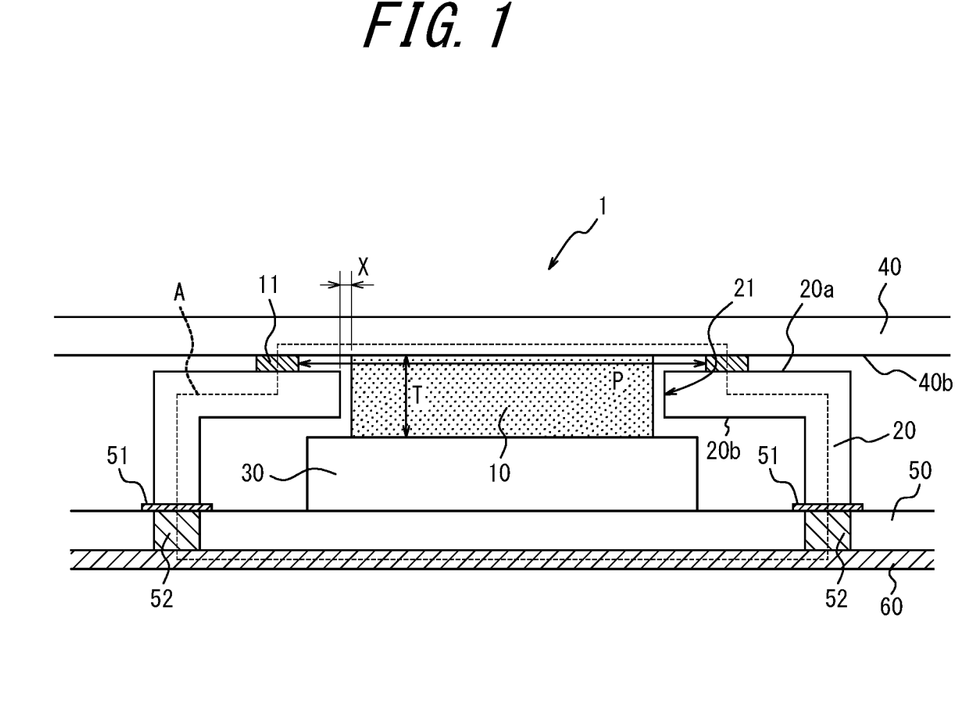
FIG. 1 is a sectional view schematically illustrating an embodiment of a semiconductor device according to the present disclosure.
Figure 2:
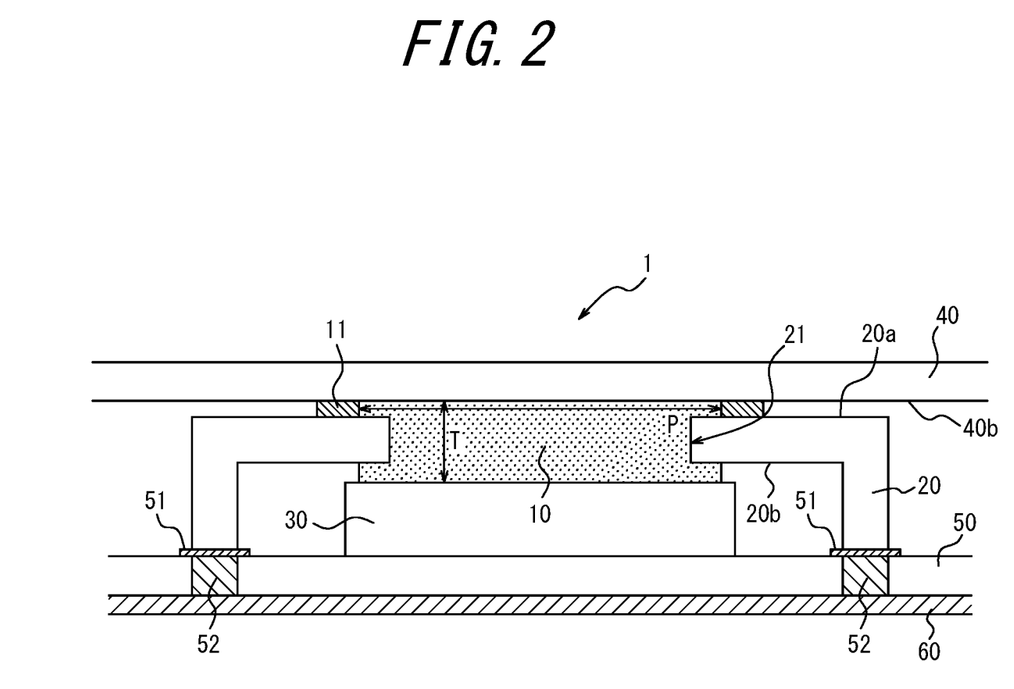
FIG. 2 is a sectional view schematically illustrating another embodiment of a semiconductor device according to the present disclosure.
Figure 3:
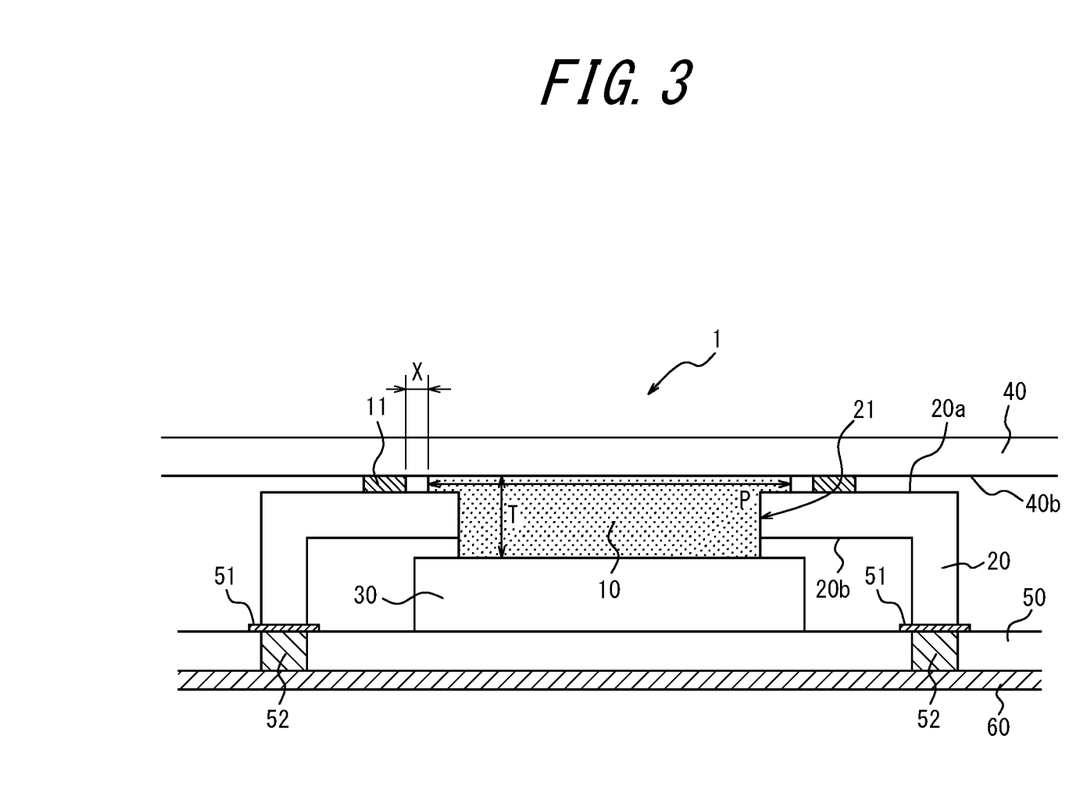
FIG. 3 is a sectional view schematically illustrating another embodiment of a semiconductor device according to the present disclosure.
Figure 4:
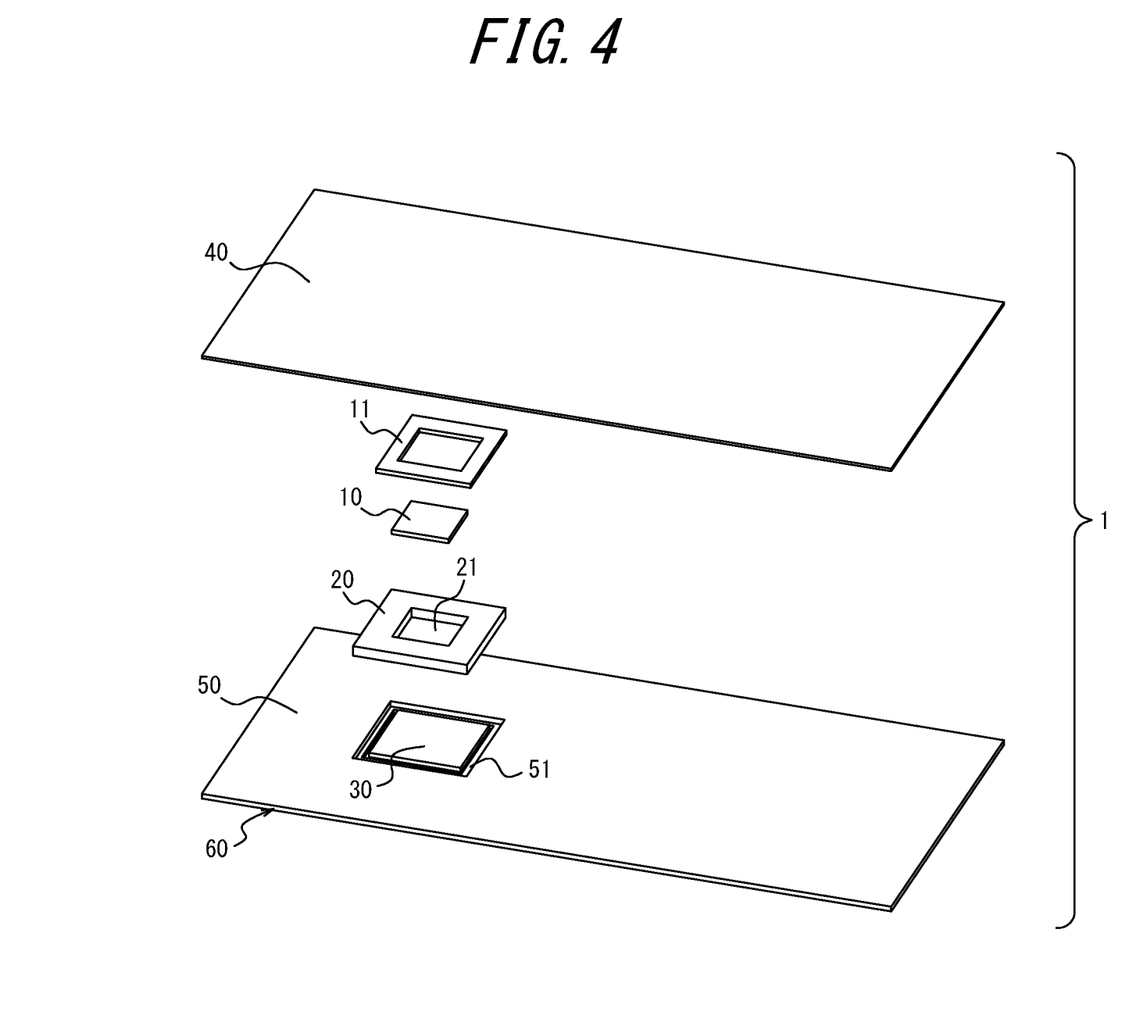
FIG. 4 is a perspective view schematically illustrating an assembly state of an embodiment of a semiconductor device according to the present disclosure.

FIGS. 1 to 3 are sectional views schematically illustrating embodiments of a semiconductor device according to the present disclosure. FIG. 4 is a perspective view for explaining an assembly state of an embodiment of a semiconductor device according to the present disclosure. In each drawing, the shape and scale of each member are different from actual shape and scale, for convenience's sake. The shape and scale of each member may be changed as appropriate for each semiconductor device, excluding limitations stated herein.

A semiconductor device 1 according to the present disclosure includes a semiconductor element 30, a conductive shield can 20, a conductive cooling member 40, a heat conductive sheet 10, and a conductive member 11, as illustrated in FIGS. 1 to 3.

The semiconductor device 1 according to the present disclosure is characterized in that the conductive shield can 20 has an opening hole hole 21 and the heat conductive sheet 10 is formed between the semiconductor element 30 and the conductive cooling member 40 through the opening hole hole 21, and that the conductive member 11 is formed between an upper surface 20a of the conductive shield can 20 and a lower surface 40b of the conductive cooling member and electrically connects the conductive shield can 20 and the conductive cooling member 40.

The semiconductor element 30 is a source of heat and electromagnetic waves. By covering the semiconductor element 30 with the conductive shield can 20, electromagnetic waves can be shielded, thus achieving excellent electromagnetic wave suppression effect. Moreover, by forming the opening hole hole 21 in the conductive shield can 20 and providing the sheet member (heat conductive sheet 10) having electromagnetic wave absorption performance and high heat conductivity between the semiconductor element 30 and the conductive cooling member 40 at least through the opening hole hole 21, heat conduction to the conductive cooling member 40 is significantly improved. Hence, excellent heat radiation performance can be achieved.

Furthermore, as a result of the conductive member 11 electrically connecting the conductive shield can 20 and the conductive cooling member 40, an electrically closed space is formed in the semiconductor device 1 according to the present disclosure, with it being possible to enhance the electromagnetic wave shielding effect of the conductive shield can 20. Thus, high electromagnetic wave suppression effect can be achieved even in the case where the conductive shield can 20 has the opening hole hole 21.

Figure 6:
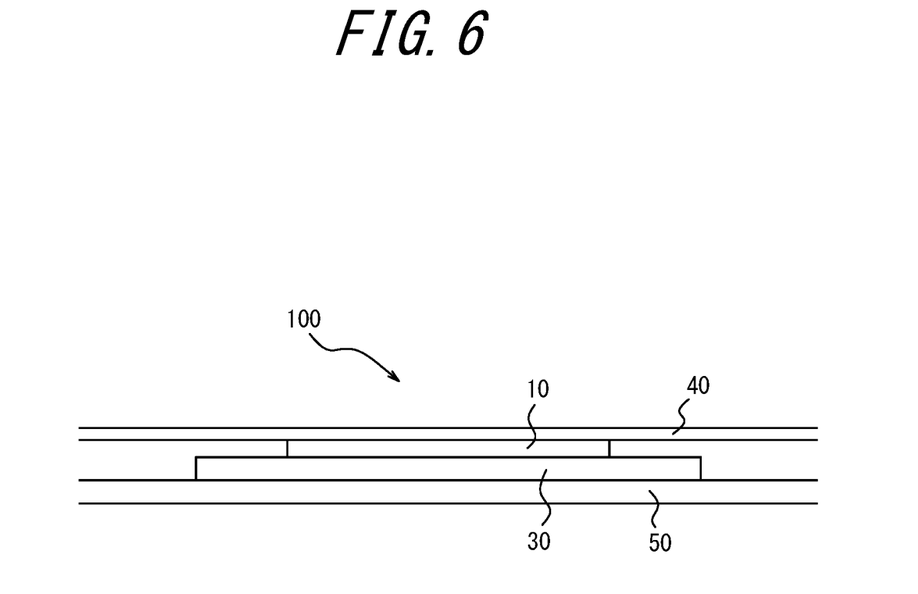
FIG. 6 is a sectional view schematically illustrating a conventional semiconductor device.

FIG. 6 illustrates an example of a conventional semiconductor device including a heat conductive sheet. In a conventional semiconductor device 100, a heat conductive sheet 10 is provided between a semiconductor element 30 and a conductive cooling member 40, so that excellent heat conductivity can be achieved. However, since there is no electromagnetic wave shielding material such as the shield can 20 in the semiconductor device 1 according to the present disclosure and no member for enhancing the electromagnetic wave shielding effect such as the conductive member 11 in the semiconductor device 1, it is difficult to achieve sufficient electromagnetic wave suppression effect.

Each member included in the semiconductor device according to the present disclosure will be described below.

(Semiconductor Element)

The semiconductor device 1 according to the present disclosure includes the semiconductor element 30 formed on a substrate 50, as illustrated in FIGS. 1 to 3.

The semiconductor element 30 is not limited, as long as it is an electronic component formed by semiconductor. Examples include integrated circuits such as IC and LSI, CPUs, MPUs, graphic arithmetic elements, and image sensors.

The substrate 50 on which the semiconductor element 30 is formed is not limited, and a suitable substrate may be used depending on the type of the semiconductor device. The substrate 50 is provided with a ground (GND) 60. The ground 60 is formed inside or on the back of the substrate 50 (in FIGS. 1 to 3, the ground 60 is formed on the back of the substrate).

In the semiconductor device 1 according to the present disclosure, a land 51 can be provided on the surface of the substrate 50 so as to wholly or partially surround the semiconductor element 30, and the conductive shield can 20 may be connected to this part using solder or the like, for example as illustrated in FIGS. 1 to 3. The land 51 is electrically connected to the ground 60 via a conductively-treated through hole 52 formed in the substrate 50. Thus, the conductive shield can 20 can be electrically joined to the ground 60. Although the conductive shield can 20 is provided on the land 51 to be electrically connected to the ground 60 in FIGS. 1 to 3, the conductive shield can 20 may pass through the substrate 50 and be directly connected to the ground 60.

(Shield Can)

The semiconductor device 1 according to the present disclosure includes the conductive shield can 20 connected to the ground 60 and having the opening hole hole 21, as illustrated in FIGS. 1 to 3.

The conductive shield can 20 connected to the ground 60 can shield electromagnetic waves. This improves the electromagnetic wave suppression effect of the semiconductor device 1 according to the present disclosure.

The material forming the shield can 20 is not limited, and a material having high electromagnetic wave shielding effect is used. Examples include highly conductive metals such as aluminum, copper, and stainless steel, and highly conductive magnetic materials. Examples of the highly conductive magnetic materials include Permalloy, Sendust, Fe-based or Co-based amorphous material, and microcrystalline material. In the case where such magnetic material is used as the material forming the shield can 20, not only electric shielding effect but also magnetic shielding effect and magnetic absorption effect can be expected.

The opening hole hole 21 in the shield can is a through hole formed in the shield can. The opening hole hole 21 is formed in a direction connecting the semiconductor element 30 and the conductive cooling member 40 (the lamination direction of the members in FIGS. 1 to 3) as illustrated in FIGS. 1 to 3, because the opening hole hole 21 is filled with the below-described heat conductive sheet 10 to connect between the semiconductor element 30 and the conductive cooling member 40.

The size of the opening hole hole 21 is not limited, and may be changed as appropriate depending on the size of the semiconductor element 30 and the like. When the opening hole hole area of the opening hole hole 21 is smaller, the emission of electromagnetic waves can be reduced, and the radiation field can be reduced. In terms of releasing heat from the semiconductor element 30, on the other hand, it is preferable to form a larger opening hole hole 21 and use a larger heat conductive sheet 10. Therefore, the size of the opening hole 21 is changed as appropriate depending on the heat conductivity and electromagnetic noise suppression effect required of the semiconductor device 1 according to the present disclosure.

(Conductive Cooling Member)

The semiconductor device 1 according to the present disclosure includes the conductive cooling member 40 above the conductive shield can 20, as illustrated in FIGS. 1 to 3.

The conductive cooling member 40 is a member for absorbing heat generated from the heat source (semiconductor element 30) and dissipating it to the outside. As a result of being connected to the semiconductor element 30 through the below-described heat conductive sheet 10, the conductive cooling member 40 can diffuse heat generated from the semiconductor element 30 to the outside, thus ensuring the heat radiation performance of the semiconductor device.

The conductive cooling member 40 has conductivity. As a result of being electrically connected to the conductive shield can 20 through the below-described conductive member 11, the conductive cooling member 40 can form an electrically closed space (region A enclosed with dashed lines in FIG. 1), thus enhancing the electromagnetic wave suppression effect of the semiconductor device 1.

The type of the conductive cooling member 40 is not limited, and may be selected as appropriate depending on the type of the semiconductor device 1 according to the present disclosure. Examples include a radiator, a cooler, a heatsink, a heat spreader, a die pad, a cooling fan, a heat pipe, a metallic cover, and a cabinet. Of these conductive cooling members, a conductive radiator, cooler, or heatsink is preferable because higher heat radiation performance can be achieved. Preferable examples of the material of the conductive cooling member 40 include metals such as aluminum, copper, and stainless steel and graphite, in terms of enhancing heat conductivity.

While the conductive cooling member 40 is located above the conductive shield can 20, preferably the conductive cooling member 40 is not in contact with the conductive shield can and is at a predetermined distance from the conductive shield can, as illustrated in FIGS. 1 to 3. This is because the below-described heat conductive sheet 10 and conductive member 11 are provided between the upper surface 20a of the conductive shield can 20 and the conductive cooling member 40.

The conductive cooling member 40 may have a projection (not illustrated) in the part of its back surface 40b in contact with the below-described conductive member 11. As a result of providing such a projection, the spacing between the conductive cooling member 40 and each of the conductive member 11 and the conductive shield can 20 provided with the conductive member 11 therebetween can be narrowed, and firm connection can be achieved even in the case where the conductive member 11 is made from films or the like.

(Heat Conductive Sheet)

The semiconductor device 1 according to the present disclosure includes the heat conductive sheet 10 formed between the semiconductor element 30 and the conductive cooling member 40 at least through the opening hole 21 of the conductive shield can 20, as illustrated in FIGS. 1 to 3.

As a result of providing the heat conductive sheet 10 having high heat conductivity between the semiconductor element 30 and the conductive cooling member 40, heat radiation performance can be improved. Moreover, in the case where the heat conductive sheet 10 has electromagnetic wave absorption performance, electromagnetic wave suppression effect can also be attained.

The shape of the heat conductive sheet 10 is not limited, and may be changed as appropriate depending on, for example, the shape of the opening hole 21 of the conductive shield can 20.

The size of the heat conductive sheet 10 is not limited. For example, the heat conductive sheet 10 may have a cross-sectional area smaller than the area of the opening hole 21 of the conductive shield can 20, as illustrated in FIG. 1. Alternatively, the heat conductive sheet 10 may be sized so as to cover part of the upper surface 20a of the conductive shield can 20, as illustrated in FIGS. 2 and 3.

In terms of achieving higher heat radiation performance and electromagnetic wave suppression effect, the heat conductive sheet 10 preferably covers part of the upper surface 20a of the conductive shield can 20, as illustrated in FIG. 3.

In terms of achieving particularly excellent electromagnetic wave suppression effect, the heat conductive sheet 10 preferably covers part of the upper surface 20a and lower surface 20b of the conductive shield can 20, as illustrated in FIG. 2.

The heat conductive sheet 10 may be made up of a single sheet, or made up of a plurality of sheets.

For example, in the case where the heat conductive sheet 10 does not cover the upper surface 20a or the lower surface 20b of the shield can 20 as illustrated in FIG. 1, the heat conductive sheet 10 may be made up of a single sheet.

Alternatively, the heat conductive sheet 10 may be made up of a plurality of sheets, for example to ease the adjustment of the sheet thickness.

In the case where the heat conductive sheet 10 covers part of the upper surface 20a and/or the lower surface 20b of the shield can 20 as illustrated in FIGS. 2 and 3, the heat conductive sheet 10 may be made up of a single sheet, or made up of a plurality of sheets. In the case where the heat conductive sheet 10 is made up of a single sheet, by pressure joining the heat conductive sheet 10 and the member (the semiconductor element 30 and the conductive cooling member 40 in FIGS. 2 and 3), part of the sheet can be pushed out to cover part of the upper surface 20a and/or the lower surface 20b of the shield can 20. In the case where the heat conductive sheet 10 is made up of a plurality of sheets, the heat conductive sheet 10 of a desired shape can be obtained by combining sheets of different sizes.

In the case where the heat conductive sheet 10 covers part of the upper surface 20a and/or the lower surface 20b of the shield can 20 as illustrated in FIGS. 2 and 3, the heat conductive sheet 10 is preferably made up of a plurality of sheets. Since a process such as pressure joining is not necessary, the heat conductive sheet 10 can be formed in a state in which the below-described fibrous heat conductive filler is oriented, as a result of which higher heat radiation performance and electromagnetic wave suppression effect can be achieved.

A structure in which the heat conductive sheet 10 has a cross-sectional area smaller than the area of the opening hole 21 of the conductive shield can 20 (i.e. there is a gap between the heat conductive sheet 10 and the ends of the conductive shield can 20) as illustrated in FIG. 1 is preferable in terms of reducing interference during mounting and reducing manufacturing cost.

If the gap between the heat conductive sheet 10 and the ends of the conductive shield can 20 is excessively large, however, the heat radiation effect is likely to decrease. Hence, the size X of the gap between the heat conductive sheet 10 and the ends of the conductive shield can 20 is preferably small, in terms of the heat radiation effect.

The thickness T of the heat conductive sheet 10 is not limited, and may be changed as appropriate depending on the distance between the semiconductor element 30 and the conductive cooling member 40, the size of the shield can 20, and the like. In terms of achieving higher heat radiation performance and electromagnetic wave suppression effect, the thickness T of the heat conductive sheet 10 is preferably 50 μm to 4 mm, more preferably 100 μm to 4 mm, and particularly preferably 200 μm to 3 mm. If the thickness T of the heat conductive sheet 10 is more than 4 mm, the distance between the semiconductor element 30 and the conductive cooling member 40 is longer, which is likely to cause a decrease in heat conduction characteristics. If the thickness T of the heat conductive sheet 10 is less than 50 μm, the electromagnetic wave suppression effect is likely to decrease.

Herein, the thickness T of the heat conductive sheet 10 refers to the thickness T of the thickest part of the heat conductive sheet 10 as illustrated in FIGS. 1 to 3, regardless of whether the heat conductive sheet 10 is made up of a single sheet or a plurality of sheets.

The heat conductive sheet 10 preferably has tackiness at its surface. This enhances the adhesiveness between the heat conductive sheet 10 and other members. In the case where the heat conductive sheet 10 is made up of a plurality of sheets, the adhesiveness between the sheets can also be enhanced.

The method of imparting tackiness to the surface of the heat conductive sheet 10 is not limited. For example, tackiness may be imparted by adjusting the below-described binder resin forming the heat conductive sheet 10. Alternatively, an adhesion layer having tackiness may be provided on the surface of the heat conductive sheet 10.

The method of changing the heat conductivity of the heat conductive sheet 10 is not limited. For example, the heat conductivity can be changed by changing the material, blending quantity, and/or orientation direction of the fibrous heat conductive filler between the sheet central portion and the sheet peripheral portion as described later.

The material forming the heat conductive sheet 10 is not limited, as long as it has excellent electromagnetic wave absorption performance and heat conductivity.

For example, in terms of achieving high electromagnetic wave absorption performance and heat conductivity, a heat conductive sheet containing a binder resin and a heat conductive filler may be used.

The material forming the heat conductive sheet 10 will be described below.

Binder Resin

The binder resin contained in the heat conductive sheet is a resin component as a base material of the heat conductive sheet. The type of the binder resin is not limited, and a known binder resin may be selected as appropriate. An example of the binder resin is thermosetting resin.

Examples of the thermosetting resin include cross-linkable rubber, epoxy resin, polyimide resin, bismaleimide resin, benzocyclobutene resin, phenol resin, unsaturated polyester, diallyl phthalate resin, silicone, polyurethane, polyimide silicone, thermosetting polyphenylene ether, and thermosetting modified polyphenylene ether. These may be used alone or in combination of two or more.

Examples of the cross-linkable rubber include natural rubber, butadiene rubber, isoprene rubber, nitrile rubber, hydrogenated nitrile rubber, chloroprene rubber, ethylene propylene rubber, chlorinated polyethylene, chlorosulfonated polyethylene, butyl rubber, halogenated butyl rubber, fluororubber, urethane rubber, acrylic rubber, and polyisobutylene rubber. These may be used alone or in combination of two or more.

Of these thermosetting resins, silicone is preferable in terms of excellent formability and weather resistance and also in terms of adhesiveness and followability to the electronic component. The silicone is not limited, and the type of the silicone may be selected as appropriate depending on the purpose.

In terms of formability, weather resistance, adhesiveness, etc., silicone containing a main ingredient of a liquid silicone gel and a hardener is preferable. Examples of such silicone include addition reaction type liquid silicone, and hot vulcanization millable type silicone with a peroxide used for vulcanization.

As the addition reaction type liquid silicone, for example, two-component addition reaction type silicone containing, as the main ingredient, polyorganosiloxane having a vinyl group and, as the hardener, polyorganosiloxane having a Si—H group is preferable.

In the combination of the main ingredient of the liquid silicone gel and the hardener, the blending proportion of the main ingredient and the hardener (main ingredient:hardener) is preferably 35:65 to 65:35 in mass ratio.

The content of the binder resin in the heat conductive sheet is not limited, and may be selected as appropriate depending on the purpose. For example, in terms of ensuring the formability of the sheet and the adhesiveness of the sheet, the content of the binder resin is preferably about 20 vol % to 50 vol % and more preferably 30 vol % to 40 vol % of the heat conductive sheet.

Heat Conductive Filler

The heat conductive sheet contains the heat conductive filler in the binder resin. The heat conductive filler is a component for improving the heat conductivity of the sheet.

The shape, material, average particle diameter, etc. of the heat conductive filler are not limited, as long as they can improve the heat conductivity of the sheet.

Examples of the shape include spherical, ellipsoidal, bulk, particulate, flat, needle-like, fibrous, and coiled. Of these, a fibrous heat conductive filler is preferable in terms of achieving higher heat conductivity.

The term "fibrous" of the fibrous heat conductive filler refers to a shape with a high aspect ratio (approximately 6 or more). Accordingly, in the present disclosure, the "fibrous heat conductive filler" encompasses, for example, not only fibrous and bar-shaped heat conductive fillers but also particulate fillers and flaky heat conductive fillers that are high in aspect ratio.

The material of the fibrous heat conductive filler is not limited, as long as it is a material with high heat conductivity. Examples include aluminum nitride (AlN), silica, alumina (aluminum oxide), boron nitride, titania, glass, zinc oxide, silicon carbide, silicon, silicon oxide, aluminum oxide, metal particles, and carbon fibers.

These heat conductive fillers may be used alone or in a mixture of two or more. In the case of using two or more heat conductive fillers, the heat conductive fillers may all have the same shape, or heat conductive fillers that differ in shape may be mixed.

Of these fibrous heat conductive fillers, a fibrous metal powder or carbon fibers are preferable and carbon fibers are more preferable, in terms of achieving higher heat conductivity.

The type of the carbon fibers is not limited, and may be selected as appropriate depending on the purpose. Examples include pitch-based carbon fibers, PAN-based carbon fibers, carbon fibers obtained by graphitizing PBO fibers, and carbon fibers synthesized by methods such as arc discharge, laser evaporation, chemical vapor deposition (CVD), and catalytic chemical vapor deposition (CCVD). Of these, carbon fibers obtained by graphitizing PBO fibers and pitch-based carbon fibers are more preferable, in terms of achieving high heat conductivity.

The carbon fibers may be wholly or partly surface-treated according to need. Examples of the surface treatment include oxidation, nitriding, nitration, sulfonation, and treatment of adhering or coupling, to a functional group introduced to the surfaces by any of such treatments or the surfaces of the carbon fibers, a metal, a metal compound, an organic compound, or the like. Examples of the functional group include hydroxyl group, carboxyl group, carbonyl group, nitro group, and amino group.

The average fiber length (average major axis length) of the fibrous heat conductive filler is not limited, and may be selected as appropriate. In terms of ensuring high heat conductivity, the average fiber length is preferably in a range of 50 μm to 300 μm, more preferably in a range of 75 μm to 275 μm, and particularly preferably in a range of 90 μm to 250 μm.

The average fiber diameter (average minor axis length) of the fibrous heat conductive filler is not limited, and may be selected as appropriate. In terms of ensuring high heat conductivity, the average fiber diameter is preferably in a range of 4 μm to 20 μm, and more preferably in a range of 5 μm to 14 μm.

The aspect ratio (average major axis length/average minor axis length) of the fibrous heat conductive filler is 6 or more, and is preferably 7 to 30, in terms of ensuring high heat conductivity. Even in the case where the aspect ratio is low, an effect of improving heat conductivity and the like is obtained. However, significant characteristics improving effect is not achieved as, for example, the orientation property decreases. The aspect ratio is therefore set to 6 or more. If the aspect ratio is more than 30, the dispersibility in the heat conductive sheet decreases, as a result of which sufficient heat conductivity is unlikely to be achieved.

Herein, the average major axis length and the average minor axis length of the fibrous heat conductive filler can each be calculated from a plurality of samples measured using, for example, a microscope or a scanning electron microscope (SEM).

The content of the fibrous heat conductive filler in the heat conductive sheet is not limited, and may be selected as appropriate depending on the purpose. The content is preferably 4 vol % to 40 vol %, more preferably 5 vol % to 30 vol %, and particularly preferably 6 vol % to 20 vol %. If the content is less than 4 vol %, it may be difficult to obtain sufficiently low heat resistance. If the content is more than 40 vol %, the formability of the heat conductive sheet and the orientation property of the fibrous heat conductive filler are likely to be affected.

In the heat conductive sheet, the heat conductive filler is preferably oriented in one or more directions. As a result of orienting the heat conductive filler, higher heat conductivity and electromagnetic wave absorbency can be achieved.

For example, to enhance the heat conductivity of the heat conductive sheet and improve the heat radiation performance of the semiconductor device according to the present disclosure, it is effective to orient the heat conductive filler in a direction substantially perpendicular to the sheet surface (i.e. orient the heat conductive filler in a direction connecting the semiconductor element and the conductive cooling member). To enhance the electromagnetic wave shielding performance of the heat conductive sheet and improve the electromagnetic wave suppression effect of the semiconductor device according to the present disclosure, the heat conductive filler may be oriented in a direction substantially parallel to the sheet surface.

Herein, the direction substantially perpendicular to the sheet surface and the direction substantially parallel to the sheet surface refer to a direction approximately perpendicular to the sheet surface direction and a direction approximately parallel to the sheet surface direction, respectively. Since the orientation direction of the heat conductive filler varies to some extent in manufacture, a deviation of about ±20° from the direction perpendicular to the sheet surface direction or the direction parallel to the sheet surface direction is acceptable in the present disclosure.

The method of adjusting the orientation angle of the heat conductive filler is not limited. For example, the orientation angle can be adjusted by producing a compact from which the heat conductive sheet is to be formed, and adjusting the cutting angle in a state in which the fibrous heat conductive filler is oriented.

Inorganic Filler

The heat conductive sheet may further contain an inorganic filler, in addition to the above-described binder resin and heat conductive fibers. This further enhances the heat conductivity of the heat conductive sheet and improves the strength of the sheet The shape, material, average particle diameter, etc. of the inorganic filler are not limited, and may be selected as appropriate depending on the purpose. Examples of the shape include spherical, ellipsoidal, bulk, particulate, flat, and needle-like. Of these, spherical or elliptic shape is preferable in terms of filling property, and spherical shape is particularly preferable.

Examples of the material of the inorganic filler include aluminum nitride (AlN), silica, alumina (aluminum oxide), boron nitride, titania, glass, zinc oxide, silicon carbide, silicon, silicon oxide, aluminum oxide, and metal particles. These may be used alone or in combination of two or more. Of these, alumina, boron nitride, aluminum nitride, zinc oxide, and silica are preferable. In terms of heat conductivity, alumina and aluminum nitride are particularly preferable.

The inorganic filler may be surface-treated. By treating the inorganic filler with a coupling agent as the surface treatment, the dispersibility of the inorganic filler is improved, and the flexibility of the heat conductive sheet is improved.

The average particle diameter of the inorganic filler may be selected as appropriate, depending on the type of the inorganic substance and the like.

In the case where the inorganic filler is alumina, its average particle diameter is preferably 1 µm to 10 µm, more preferably 1 µm to 5 µm, and particularly preferably 4 µm to 5 µm. If the average particle diameter is less than 1 µm, viscosity increases, which may hinder mixing. If the average particle diameter is more than 10 µm, the heat resistance of the heat conductive sheet is likely to increase.

In the case where the inorganic filler is aluminum nitride, its average particle diameter is preferably 0.3 µm to 6.0 µm, more preferably 0.3 µm to 2.0 µm, and particularly preferably 0.5 µm to 1.5 µm. If the average particle diameter is less than 0.3 µm, viscosity increases, which may hinder mixing. If the average particle diameter is more than 6.0 µm, the heat resistance of the heat conductive sheet is likely to increase.

The average particle diameter of the inorganic filler can be measured, for example, by a particle size analyzer or a scanning electron microscope (SEM).

Magnetic Metal Powder

The heat conductive sheet preferably further contains a magnetic metal powder, in addition to the above-described binder resin, fibrous heat conductive fibers, and inorganic filler. As a result of the heat conductive sheet containing the magnetic metal powder, the electromagnetic wave absorbency of the heat conductive sheet can be improved.

The type of the magnetic metal powder is not limited as long as it has electromagnetic wave absorbency, and a known magnetic metal powder may be selected as appropriate. For example, an amorphous metal powder or a crystalline metal powder may be used. Examples of the amorphous metal powder include Fe—Si—B—Cr-based, Fe—Si—B-based, Co—Si—B-based, Co—Zr-based, Co—Nb-based, and Co—Ta-based. Examples of the crystalline metal powder include pure iron, Fe-based, Co-based, Ni-based, Fe—Ni-based, Fe—Co-based, Fe—Al-based, Fe—Si-based, Fe—Si—Al-based, and Fe—Ni—Si—Al-based. As the crystalline metal powder, a microcrystalline metal powder obtained by adding a trace amount of N (nitrogen), C (carbon), O (oxygen), B (boron), or the like to a crystalline metal powder for refinement may be used.

A mixture of two or more magnetic metal powders of different materials or different average particle diameters may be used.

The shape of the magnetic metal powder is preferably adjusted to be spherical, flat, or the like. For example, to increase the filling property, it is preferable to use a spherical magnetic metal powder having a particle diameter of several µm to several ten µm. Such a magnetic metal powder can be produced, for example, by an atomizing method or a method of thermally decomposing metal carbonyl. The atomizing method has an advantage that a spherical powder can be formed easily, and is a method of discharging molten metal from a nozzle and spraying a jet stream of air, water, inert gas, or the like to the discharged molten metal to solidify it as droplets, thus forming a powder. When producing an amorphous magnetic metal powder by the atomizing method, the cooling rate is preferably about $1 \times 10^6$ (K/s), to prevent the molten metal from crystallization.

An amorphous alloy powder produced by the atomizing method has a smooth surface. By using such an amorphous alloy powder with low surface roughness and a small specific surface area as the magnetic metal powder, the filling property for the binder resin can be enhanced. The filling property can be further improved by performing coupling treatment.

The heat conductive sheet may optionally contain other components depending on the purpose, in addition to the above-described binder resin, fibrous heat conductive filler, inorganic filler, and magnetic metal powder.

Examples of the other components include thixotropy-imparting agents, dispersants, curing accelerators, retarders, fine tackifiers, plasticizers, flame retardants, antioxidants, stabilizers, and colorants.

(Conductive Member)

The semiconductor device 1 according to the present disclosure includes the conductive member 11 formed between the upper surface 20a of the conductive shield can 20 and the lower surface 40b of the conductive cooling member 40, as illustrated in FIGS. 1 to 3.

As a result of the conductive member 11 electrically connecting the conductive shield can 20 and the conductive cooling member 40, an electrically closed space (region A enclosed with dashed lines in FIG. 1) can be formed even in the case where the conductive shield can 20 has the opening hole 21. This can enhance the electromagnetic noise suppression effect.

The shape and the material of the conductive member 11 are not limited, as long as the conductive member 11 is formed between the upper surface 20a of the conductive shield can 20 and the lower surface 40b of the conductive cooling member 40 and has conductivity as mentioned above.

For example, the conductive member 11 may be shaped like a sheet with a hole at its center, as illustrated in FIG. 4. Thus, the conductive member 11 can be provided to surround the opening hole 21 of the conductive shield can 20 and electrically connect the conductive shield can 20 and the conductive cooling member 40, as illustrated in FIGS. 1 to 3.

The conductive member 11 is not limited to the sheet shape illustrated in FIG. 4, and may have any of various shapes such as sponge, paste, gel, and thread. The shape of the conductive member 11 can be selected as appropriate depending on the shape of the opening hole 21 of the conductive shield can 20, the distance between the upper surface 20a of the conductive shield can 20 and the lower surface 40b of the conductive cooling member 40, and the like.

In a cross section of the conductive member 11 along the lamination direction as illustrated in FIGS. 1 to 3, the spacing P between parts of the conductive member 11 facing each other with the heat conductive sheet 10 therebetween is preferably less than or equal to 1/10 of the wavelength at the maximum frequency of the semiconductor element. This further ensures high electromagnetic wave suppression effect. For example, in the case where the frequency is 1 GHz, the wavelength is 300 mm (speed of light/frequency). In such a case, the spacing P is preferably less than or equal to 30 mm.

The conductive member 11 may be one member as illustrated in FIG. 4, or may be made up of a plurality of members. In terms of manufacturability, the conductive member 11 is preferably made up of a plurality of members, because its shape can be changed freely.

The plurality of members may have the same shape, or members that differ in shape may be used in combination.

In the case where the conductive member 11 is made up of a plurality of members, the spacing between the members is preferably less than or equal to 1/10 of the wavelength at the maximum frequency of the semiconductor element in terms of ensuring high electromagnetic wave suppression effect, as with the spacing P between parts of the conductive member 11 facing each other with the heat conductive sheet 10 therebetween.

The conductive member 11 is preferably connected to the conductive shield can 20 and the conductive cooling member 40 to form an electrically closed space (region enclosed with dashed line), as illustrated in FIG. 1. This can achieve higher electromagnetic wave suppression effect.

The material forming the conductive member 11 is not limited, as long as it has conductivity.

For example, the material of the conductive member 11 preferably contains at least a binder resin and a conductive filler, in terms of ensuring electrical connection between the conductive shield can 20 and the conductive cooling member 40.

The binder resin contained in the material of the conductive member 11 is a cured resin and is a base material of the conductive member 11. In terms of formability, flexibility, and the like, the same binder resin as that used in the heat conductive sheet 10 may be used.

In an embodiment in which the conductive member 11 and the heat conductive sheet 10 are in contact with each other as illustrated in FIG. 2, the heat conductive sheet 10 may be made of the same material as the conductive member 11 (i.e. the heat conductive sheet 10 may serve as the conductive member 11).

The heat conductive filler contained in the material of the conductive member 11 preferably has high conductivity. Examples of such a heat conductive filler include metal powders, metal film resins, conductive polymers, conductive particles, metal fibers, metal film fibers, and carbonaceous fillers such as graphite, black lead, and carbon fibers.

The shape of the heat conductive filler is not limited, and examples include spherical, ellipsoidal, bulk, particulate, flat, needle-like, fibrous, coiled, and netlike.

The material of the conductive member 11 may further contain various additives, besides the foregoing binder resin and heat conductive filler.

Examples of the additives include magnetic powders, thixotropy-imparting agents, dispersants, curing accelerators, retarders, fine tackifiers, plasticizers, flame retardants, antioxidants, and stabilizers.

The material of the conductive member 11 may be a commercial product. For example, EC series (volume resistivity: 0.009 Ωm, 0.025 Ωm, 0.05 Ωm) manufactured by Shin-Etsu Chemical Co., Ltd., which is a silicone-based sheet with low resistivity, may be used. Further, an anisotropic conductive sheet (for example, CP series manufactured by Dexerials Corporation) often used for electrical connection between electrodes may be used.

The conductive member 11 preferably has higher conductivity than the heat conductive sheet 10, in terms of achieving excellent electromagnetic wave suppression effect.

Specifically, the resistance value of the conductive member 11 is preferably 2Ω or less, more preferably 0.2Ω or less, further preferably 0.1Ω or less, particularly preferably 0.01Ω or less, and most preferably 0.001Ω or less. As a result of the resistance value of the conductive member 11 being 2Ω or less, higher electromagnetic wave suppression effect can be achieved.

The method of changing the heat conductivity (resistance value) of the conductive member 11 is not limited. For example, the heat conductivity can be changed by changing the type of the binder resin, the material, blending quantity, and/or orientation direction of the heat conductive filler, and the like.

The conductive member 11 preferably has tackiness or adhesiveness at its surface. This increases the adhesion force between the conductive member 11 and other members (specifically, the force of adhesion to the conductive shield can 20 and the conductive cooling member 40). Hence, even when the semiconductor device 1 is subjected to an external shock, the electrical connection state can be maintained and a decrease of the electromagnetic wave suppression effect can be suppressed.

The method of imparting tackiness or adhesiveness to the surface of the conductive member 11 is not limited. As an example, the binder resin included in the conductive member 11 may be prepared so as to improve the adhesion force. As another example, a tacky material may be applied to the surface of the conductive member 11.

The position at which the conductive member 11 is located is not limited, as long as it is between the upper surface 20a of the conductive shield can 20 and the lower surface 40b of the conductive cooling member 40.

For example, the conductive member 11 may be separate from the heat conductive sheet 10, as illustrated in FIGS. 1 and 3. Alternatively, the conductive member 11 may be in contact with the heat conductive sheet 10, as illustrated in FIG. 2.

EXAMPLES

More detailed description will be given below by way of examples, although the present disclosure is not limited to such examples.

Example 1

Figure 5A:
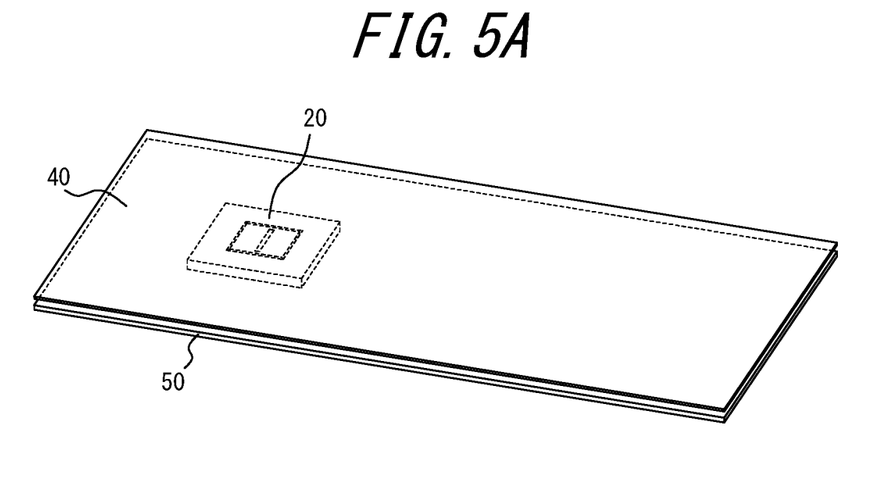
FIG. 5A is a top view schematically illustrating a model of a semiconductor device used in analysis of frequency characteristics in an example.
Figure 5B:
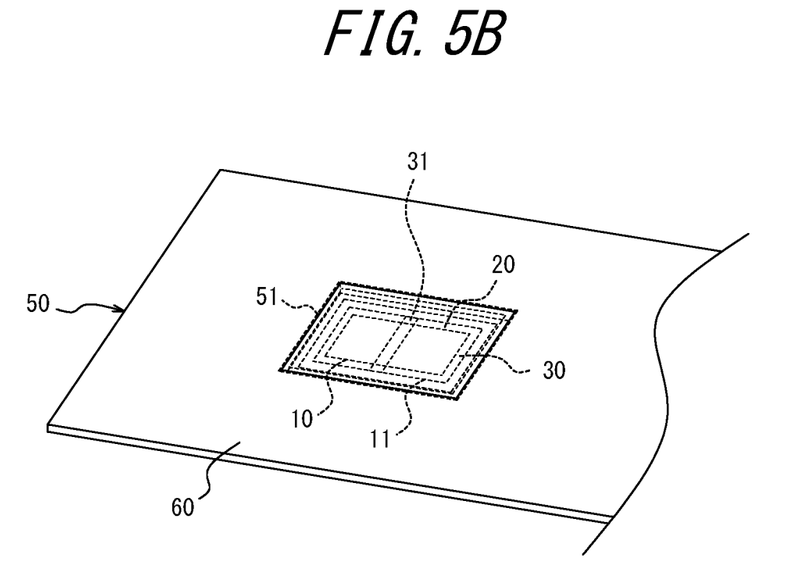
FIG. 5B is a back view schematically illustrating the model of a semiconductor device.

In Example 1, each analysis model of a semiconductor device as illustrated in FIGS. 5A and 5B was made using a 3D electromagnetic field simulator ANSYS HFSS (manufactured by ANSYS, Inc.), and its electromagnetic wave suppression effect was evaluated.

For the heat conductive sheet 10 used in the model of a semiconductor device, two-component addition reaction type liquid silicone was used as a resin binder, Fe—Si—B—Cr amorphous magnetic particles with an average particle diameter of 5 μm were used as a magnetic metal powder, and pitch-based carbon fibers ("heat conductive fibers" manufactured by Nippon Graphite Fiber Corporation) with an average fiber length of 200 μm were used as a fibrous heat conductive filler, which were dispersed at a volume ratio (two-component addition reaction type liquid silicone:amorphous magnetic particles:pitch-based carbon fibers) of 35 vol %:53 vol %:12 vol % to prepare a silicone composition (sheet composition). The resultant heat conductive sheet had an average heat conductivity in the vertical direction (the heat resistance at the interface and the heat resistance inside were calculated together) of 9.2 W/m·K as measured in accordance with ASTM D5470. As the magnetic characteristics and dielectric characteristics of the sheet, values measured by S-parameter method were used. The thickness T of the heat conductive sheet 10 was 0.7 mm.

For the cooling member 40 (heatsink) used in the model of a semiconductor device, an aluminum plate was used as material, with a size of 60 mm×120 mm and a thickness of 0.3 mm.

The shield can 20 was made of stainless steel with a thickness of 0.2 mm, with an outer diameter of 20 mm×20 mm×1.2 mm. The opening hole 21 was formed at its center. The size of the opening hole 21 was □10 mm: 10 mm×10 mm.

Figure 7:
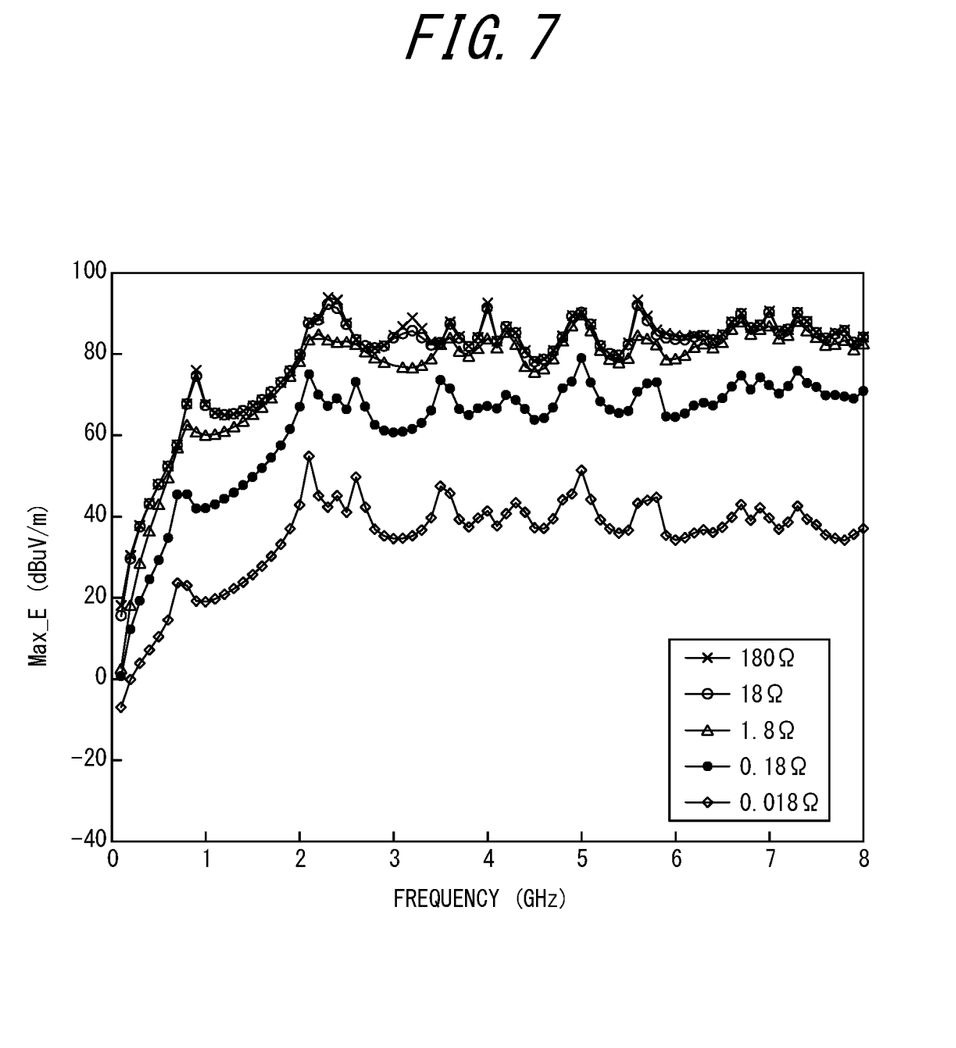
FIG. 7 is a graph illustrating the electric field strength depending on frequency of each sample that differs in resistance value of a conductive member of a semiconductor device, in Example 1.

As the conductive member 11, a sheet-like member having an outer diameter of 16 mm×16 mm×0.2 mm and an opening hole of □12 mm was formed using, as a binder resin, the same silicone as in the heat conductive sheet 10 and using, as a conductive filler, carbon fibers. Samples of 180Ω, 18Ω, 1.8Ω, 0.18Ω, and 0.018Ω in the resistance value of the conductive member 11 were produced by changing the content of the conductive filler, as illustrated in FIG. 7.

FIGS. 5A and 5B are respectively a top view (upper side) and a back view (lower side) of the analysis model of a semiconductor device. In FIGS. 5A and 5B, each member constituting the semiconductor device is illustrated in a perspective view to indicate the positional relationships between the members.

The sectional structure of the analysis model is the same as above analysis model shown in FIG. 1. The semiconductor element 30 was a microstripline (MSL) 31 covered with a resin mold, as illustrated in FIGS. 5A and 5B. The MSL 31 was obtained by providing a copper signal line (signal line size: 1 mm×14 mm×0.02 mm) on the front side of the dielectric substrate 50 (substrate size: 60 mm×120 mm×0.65 mm) and the ground 60 on the back side of the dielectric substrate 50. A signal source of the semiconductor element 30 was simplified as this MSL 31, with both ends being set as signal input and output ends. The body (the part molded with the resin) of the semiconductor element 30 was a dielectric having a relative permittivity of 4 and a dielectric loss tangent of 0.01. The size of the body of the semiconductor element 30 was 16 mm×16 mm×0.7 mm.

In the evaluation of the electromagnetic wave suppression effect, the maximum electric field strength at a position of 3 m away from the semiconductor device was calculated, and indicated as the electric field strength (dBμV/m) depending on frequency. FIG. 7 illustrates the electric field strength calculation results. The results of using the samples of 180Ω, 18Ω, 1.8Ω, 0.18Ω, and 0.018Ω in the resistance value of the conductive member 11 are illustrated in FIG. 7.

As can be seen from the results in FIG. 7, the electromagnetic wave suppression effect was achieved by providing the conductive member 11, and a lower resistance value of the conductive member 11 contributed to higher electromagnetic wave suppression effect.

In particular, samples including the conductive members 11 of 0.18Ω and 0.018Ω in resistance value had lower electric field strength and exhibited higher electromagnetic wave suppression effect.

INDUSTRIAL APPLICABILITY

It is thus possible to provide a semiconductor device having excellent heat radiation performance and electromagnetic wave suppression effect.

REFERENCE SIGNS LIST 1 semiconductor device
10 heat conductive sheet
11 conductive member
20 conductive shield can
20a upper surface of conductive shield can
20b lower surface of conductive shield can
21 opening hole
30 semiconductor element
31 MSL
40 conductive cooling member
40b lower surface of conductive cooling member
50 substrate
51 land
52 conductively-treated through hole
60 ground
100 conventional semiconductor device
A electrically closed space
T thickness of heat conductive sheet
P spacing between parts of conductive member facing each other with heat conductive sheet therebetween

The invention claimed is:

1. A semiconductor device comprising:
   a semiconductor element formed on a substrate;
   a conductive shield can connected to a ground and having an opening hole;
   a conductive cooling member located above the conductive shield can;
   a heat conductive sheet formed between the semiconductor element and the conductive cooling member at least through the opening hole of the conductive shield can; and
   a conductive member formed between an upper surface of the conductive shield can and a lower surface of the conductive cooling member, and electrically connecting the conductive shield can and the conductive cooling member wherein
   a spacing between parts of the conductive member facing each other with the heat conductive sheet therebetween is less than or equal to 1/10 of a wavelength at a maximum frequency of the semiconductor element.

2. The semiconductor device according to claim 1, wherein the conductive member is connected to the conductive shield can and the conductive cooling member, to form an electrically closed region.

3. The semiconductor device according to claim 1, wherein a resistance value of the conductive member is 2Ω or less.

4. The semiconductor device according to claim 1, wherein the conductive member has tackiness or adhesiveness at a surface thereof.

5. The semiconductor device according to claim 1, wherein the conductive member contains a cured resin.

6. The semiconductor device according to claim 1, wherein the conductive member contains a conductive filler.

7. The semiconductor device according to claim 1, wherein the heat conductive sheet contains carbon fibers.

\* \* \* \* \*